(12) United States Patent
Xiao et al.

(10) Patent No.: US 9,933,889 B2
(45) Date of Patent: Apr. 3, 2018

(54) GOA DRIVING CIRCUIT

(71) Applicant: Wuhan China Star Optoelectronics Technology Co., Ltd., Wuhan (CN)

(72) Inventors: Juncheng Xiao, Wuhan (CN); Yao Yan, Wuhan (CN); Shangcao Cao, Wuhan (CN); Ronglei Dai, Wuhan (CN)

(73) Assignee: WUHAN CHINA STAR OPTOELECTRONICS TECHNOLOGY CO., LTD., Wuhan, Hubei (CN)

( * ) Notice: Subject to any disclaimer, the term of this patent is extended or adjusted under 35 U.S.C. 154(b) by 258 days.

(21) Appl. No.: 15/026,595

(22) PCT Filed: Feb. 25, 2016

(86) PCT No.: PCT/CN2016/074497
§ 371 (c)(1),
(2) Date: Mar. 31, 2016

(87) PCT Pub. No.: WO2017/117849
PCT Pub. Date: Jul. 13, 2017

(65) Prior Publication Data
US 2018/0046308 A1    Feb. 15, 2018

(30) Foreign Application Priority Data

Jan. 4, 2016  (CN) .......................... 2016 1 0003818

(51) Int. Cl.
*G11C 19/00*     (2006.01)
*G06F 3/041*     (2006.01)
(Continued)

(52) U.S. Cl.
CPC ......... *G06F 3/0416* (2013.01); *G09G 3/3659* (2013.01); *G09G 3/3677* (2013.01);
(Continued)

(58) Field of Classification Search
None
See application file for complete search history.

(56) References Cited

U.S. PATENT DOCUMENTS 9,799,293 B2 *  10/2017  Xiao .................... G09G 3/3677
9,805,680 B2 *  10/2017  Xiao .................... G09G 3/3677
(Continued)

FOREIGN PATENT DOCUMENTS

CN       105047168 A      11/2015
CN       105206244 A      12/2015

*Primary Examiner* — Tuan T Lam
(74) *Attorney, Agent, or Firm* — Leong C. Lei

(57) ABSTRACT

Disclosed is a GOA driving circuit. In screen awakening stage, the first global control signal (Gas1) controls the twelfth thin film transistor (T12) to be activated for realizing the All Gate On function, and meanwhile controls the eleventh thin film transistor (T11) to be activated to pull down the voltage level of the second node (P(n)); in reset stage, the reset signal (Reset) controls the first thin film transistor (T1) to reset the voltage level of the second node (P(n)), and to set the duration of the single pulse of the reset signal (Reset) to be at least the sum of durations of initial pulses of the first, second clock signals; in touch scan stage, the second global control signal (Gas2) controls the thirteenth thin film transistor (T13) to be activated to make the output ends of the GOA units of the respective stages output composite signals (CS).

17 Claims, 9 Drawing Sheets

(51) Int. Cl.
*G09G 3/36* (2006.01)
*G11C 19/28* (2006.01)

(52) U.S. Cl.
CPC ........... *G09G 2300/0852* (2013.01); *G09G 2300/0871* (2013.01); *G09G 2310/021* (2013.01); *G09G 2310/0245* (2013.01); *G09G 2310/0281* (2013.01); *G09G 2310/0286* (2013.01); *G09G 2310/0289* (2013.01); *G09G 2310/063* (2013.01); *G09G 2310/08* (2013.01); *G09G 2354/00* (2013.01); *G11C 19/28* (2013.01)

(56) References Cited

U.S. PATENT DOCUMENTS

| | | | |
|---|---|---|---|
| 2017/0102805 A1* | 4/2017 | Xiao | G06F 3/0412 |
| 2017/0124975 A1* | 5/2017 | Xiao | G06F 3/0412 |
| 2017/0162148 A1* | 6/2017 | Xiao | G09G 3/3674 |
| 2017/0169783 A1* | 6/2017 | Xiao | G09G 3/3677 |
| 2017/0193944 A1* | 7/2017 | Xiao | G09G 3/3677 |
| 2017/0193956 A1* | 7/2017 | Xiao | G09G 3/3696 |
| 2017/0256217 A1* | 9/2017 | Xiao | G09G 3/3677 |
| 2017/0256219 A1* | 9/2017 | Xiao | G09G 3/3677 |

* cited by examiner

GOA DRIVING CIRCUIT

FIELD OF THE INVENTION

The present invention relates to a display technology field, and more particularly to a GOA driving circuit.

BACKGROUND OF THE INVENTION

The Liquid Crystal Display (LCD) possesses advantages of thin body, power saving and no radiation to be widely used in many application scope, such as LCD TV, mobile phone, personal digital assistant (PDA), digital camera, notebook, laptop, and dominates the flat panel display field.

The Active Matrix Liquid Crystal Display (AMLCD) is the most common liquid crystal display device at present. The Active Matrix Liquid Crystal Display comprises a plurality of pixels, and each pixel comprises a Thin Film Transistor (TFT). The gate of the TFT is coupled to the scan line extending along the horizontal direction. The drain of the TFT is coupled to the data line extending along the vertical direction. The source of the TFT is coupled to the corresponding pixel electrode. When a sufficient positive voltage is applied to some scan line in the horizontal direction, all the TFT coupled to the scan line will be activated to write the data signal loaded in the data line into the pixel electrodes and thus to show images to control the transmittances of different liquid crystals to achieve the effect of controlling colors.

The driving of the level scan line (i.e. the gate driving) in the present active liquid crystal display is initially accomplished by the external Integrated Circuit (IC). The external IC can control the charge and discharge stage by stage of the level scan lines of respective stages. The GOA technology, i.e. the Gate Driver on Array technology can utilize the array manufacture processes of the liquid crystal display panel to manufacture the driving circuit of the level scan lines on the substrate around the active area, to replace the external IC for accomplishing the driving of the level scan lines. The GOA technology can reduce the bonding procedure of the external IC and has potential to raise the productivity and lower the production cost. Meanwhile, it can make the liquid crystal display panel more suitable to the narrow frame design of display products.

The embedded touch control technology is to combine the touch control panel and the display panel as one, and to merge the function of the touch control panel into the liquid crystal panel to make the liquid crystal panel equipped with functions of display and sensing the touch control inputs at the same time. With the rapid development of the display technology, the touch control display panel has been widely applied and accepted, used by the people. For example, the smart phone, the flat panel computer and etc. all use the touch control display panel.

The present embedded touch control technology can be categorized into two types: one is that the touch control circuit is on the liquid crystal cell (On Cell), and the other is that the touch control circuit is inside the liquid crystal cell (In Cell).

As the GOA driving circuit applied in the touch display panel awakens the panel screen, it requires a certain duration for realizing the (All Gate On) function that all the output ends of the respective GOA units, and the gate scan driving signals are all outputted at the same time for activating the TFTs of all pixels in the panel, and clearing the residual voltage level in the pixel. Meanwhile, it is also required that as the GOA circuit normally works in display procedure, it has to shut down the output ends of the GOA units of all stages in the GOA circuit at arbitrary moment, and to stop the output of the gate scan driving signal for performing the touch scan. After the touch scan is accomplished, the GOA circuit returns to be normal, and continues to output the gate scan driving signal for display. However, the circuit failure risk exist as the GOA circuit applied in the touch display panel according to prior art achieves the All Gate On and the touch scan function, and the stability is worse.

SUMMARY OF THE INVENTION

An objective of the present invention is to provide a GOA driving circuit, which can ensure that the touch display panel performs normal display after the screen is awakened to eliminate the failure risk as the GOA circuit achieves the All Gate On and touch scan function for promoting the stability of the GOA driving circuit.

For realizing the aforesaid objective, the present invention provides a GOA driving circuit, comprising GOA units of a plurality of stages which are cascade coupled, and the GOA unit of each stage comprises: a forward-backward scan control module, a basic output module, a basic output pull-down module, a first node control module, a second node control module, an output control module, a reset module, a voltage stabilizing module and a second node charging module;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a ninth thin film transistor, and a gate of the ninth thin film transistor is coupled to an output end of the two former n−2th stage GOA unit, and a source receives a forward scan control signal, and a drain is electrically coupled to a first node; and a tenth thin film transistor, and a gate of the tenth thin film transistor is coupled to an output end of the two latter stage n+2th GOA unit, and a source receives a backward scan control signal, and a drain is electrically coupled to the first node;

the basic output module comprises: a seventh thin film transistor, and a gate of the seventh thin film transistor is electrically coupled to a drain of a sixth thin film transistor, and a source receives a Mth clock signal, and a drain is electrically coupled to an output end; and a first capacitor, and one end of the first capacitor is electrically coupled to the drain of the sixth thin film transistor, and the other end is electrically coupled to the output end;

the basic output pull-down module comprises: an eighth thin film transistor, and a gate of the eighth thin film transistor is electrically coupled to the second node, and a source receives a composite signal, and a drain is electrically coupled to the output end; and a second capacitor, and one end of the second capacitor is electrically coupled to the second node, and the other end receives the composite signal;

the first node control module comprises: a fourth thin film transistor, and a gate of the fourth thin film transistor receives the Mth clock signal, and a source is electrically coupled to the a drain of a fifth thin film transistor, and a drain is electrically coupled to the first node; and the fifth thin film transistor, and a gate of the fifth thin film transistor is electrically coupled to the second node, and a source receives the composite signal;

the second node control module comprises: an eleventh thin film transistor, and a gate of the eleventh thin film transistor receives a first global control signal, and a source receives the composite signal, and a drain is electrically coupled to the second node;

the output control module comprises: a twelfth thin film transistor, and both a gate and a source of the twelfth thin film transistor receive the first global control signal, and a drain is electrically coupled to the output end; and a thirteenth thin film transistor, and a gate of the thirteenth thin film transistor receives a second global control signal, and a source receives the composite signal, and a drain is electrically coupled to the output end;

the reset module comprises: a first thin film transistor, and both a gate and a source of the first thin film transistor receives a reset signal, and a drain is electrically coupled to the second node;

the voltage stabilizing module comprises: a sixth thin film transistor, and a gate of the sixth thin film transistor receives a control voltage level, and a source is electrically coupled to the first node, and a drain is electrically coupled to the gate of the seventh thin film transistor;

the second node charging module comprises: a third thin film transistor, and a gate of the third thin film transistor receives a M−2th clock signal, and a source receives the control voltage level, and a drain is electrically coupled to the second node; and a second thin film transistor, and a gate of the second thin film transistor is electrically coupled to the first node, and a source receives the M−2th clock signal, and a drain is electrically coupled to the second node;

a working procedure of the GOA driving circuit comprises: a screen awakening stage, a reset stage, a normal display stage and a touch scan stage in order;

in the screen awakening stage, the first global control signal controls the twelfth thin film transistors and the eleventh thin film transistors of the GOA units of all stages to be activated, and the second global control signal controls the thirteenth thin film transistors of the GOA units of all stages to be deactivated; in the reset stage and the normal display stage, the first global control signal controls the twelfth thin film transistors and the eleventh thin film transistors of the GOA units of all stages to be deactivated, and the second global control signal controls the thirteenth thin film transistors of the GOA units of all stages to be deactivated; in the touch scan stage, the second global control signal controls the thirteenth thin film transistors of the GOA units of all stages to be activated, and the first global control signal controls the twelfth thin film transistors and the eleventh thin film transistors of the GOA units of all stages to be deactivated;

in the reset stage, the reset signal provides a single pulse to control the first thin film transistor to be activated to reset a voltage level of the second node, and a duration of the single pulse of the reset signal is at least a sum of durations of initial pulses of a first clock signal and a second clock signal;

in the reset stage and the normal display stage, voltage levels of the composite signal and the control voltage level are one high and one low, and voltage levels of the forward scan control signal and the backward scan control signal are one high and one low; in the touch scan stage, the composite signal is a pulse signal having the same frequency with a touch scan signal.

Selectably, in the reset stage and the normal display stage, respective clock signals are all periodic pulse signals; in the touch scan stage, voltage levels of the respective clock signals are constant.

Selectably, in the reset stage and the normal display stage, respective clock signals are all periodic pulse signals; in the touch scan stage, the respective clock signals are pulse signals having the same frequency with the touch scan signal.

Selectably, the respective thin film transistors are all N-type thin film transistors.

in the screen awakening stage, the first global control signal is high voltage level, and the second global control signal is low voltage level; in the reset stage and the normal display stage, both the first global control signal and the second global control signal are low voltage levels; in the touch scan stage, the second global control signal is high voltage level, and the first global control signal is low voltage level;

in the reset stage and the normal display stage, a voltage level of the composite signal is low voltage level, and the control voltage level is high voltage level; all the respective clock signals are periodic high voltage level pulse signals.

In the touch scan stage, all voltage levels of the respective clock signals are constant low voltage levels.

As performing forward scan, the forward scan control signal is constant high voltage level, and the backward scan control signal is constant low voltage level; as performing backward scan, the forward scan control signal is constant low voltage level, and the backward scan control signal is constant high voltage level.

Selectably, the respective thin film transistors are all P-type thin film transistors.

in the screen awakening stage, the first global control signal is low voltage level, and the second global control signal is high voltage level; in the reset stage and the normal display stage, both the first global control signal and the second global control signal are high voltage levels; in the touch scan stage, the second global control signal is low voltage level, and the first global control signal is high voltage level;

in the reset stage and the normal display stage, a voltage level of the composite signal is high voltage level, and the control voltage level is low voltage level; all the respective clock signals are periodic high voltage level pulse signals.

In the touch scan stage, all voltage levels of the respective clock signals are constant high voltage levels.

As performing forward scan, the forward scan control signal is constant high voltage level, and the backward scan control signal is constant low voltage level; as performing backward scan, the forward scan control signal is constant low voltage level, and the backward scan control signal is constant high voltage level.

In the first stage GOA unit and the second stage GOA unit, the gate of the ninth thin film transistor receives a start signal of the circuit; in the next to last stage GOA unit and the last stage GOA unit, the gate of the tenth thin film transistor receives the start signal of the circuit;

and the GOA driving circuit comprises four clock signals: a first, a second, a third and a fourth clock signals; as the Mth clock signal is the first clock signal, the M−2th clock signal is the third clock signal; as the Mth clock signal is the second clock signal, the M−2th clock signal is the fourth clock signal; in the reset stage and the normal display stage, pulse periods of the first, second, third and fourth clock signals are the same, and while a pulse signal of the former clock signal is finished, a pulse signal of the latter clock signal is generated.

The present invention further provides a GOA driving circuit, comprising GOA units of a plurality of stages which are cascade coupled, and the GOA unit of each stage comprises: a forward-backward scan control module, a basic output module, a basic output pull-down module, a first node control module, a second node control module, an output control module, a reset module, a voltage stabilizing module and a second node charging module;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a ninth thin film transistor, and a gate of the ninth thin film transistor is coupled to an output end of the two former n−2th stage GOA unit, and a source receives a forward scan control signal, and a drain is electrically coupled to a first node; and a tenth thin film transistor, and a gate of the tenth thin film transistor is coupled to an output end of the two latter stage n+2th GOA unit, and a source receives a backward scan control signal, and a drain is electrically coupled to the first node;

the basic output module comprises: a seventh thin film transistor, and a gate of the seventh thin film transistor is electrically coupled to a drain of a sixth thin film transistor, and a source receives a Mth clock signal, and a drain is electrically coupled to an output end; and a first capacitor, and one end of the first capacitor is electrically coupled to the drain of the sixth thin film transistor, and the other end is electrically coupled to the output end;

the basic output pull-down module comprises: an eighth thin film transistor, and a gate of the eighth thin film transistor is electrically coupled to the second node, and a source receives a composite signal, and a drain is electrically coupled to the output end; and a second capacitor, and one end of the second capacitor is electrically coupled to the second node, and the other end receives the composite signal;

the first node control module comprises: a fourth thin film transistor, and a gate of the fourth thin film transistor receives the Mth clock signal, and a source is electrically coupled to the a drain of a fifth thin film transistor, and a drain is electrically coupled to the first node; and the fifth thin film transistor, and a gate of the fifth thin film transistor is electrically coupled to the second node, and a source receives the composite signal;

the second node control module comprises: an eleventh thin film transistor, and a gate of the eleventh thin film transistor receives a first global control signal, and a source receives the composite signal, and a drain is electrically coupled to the second node;

the output control module comprises: a twelfth thin film transistor, and both a gate and a source of the twelfth thin film transistor receive the first global control signal, and a drain is electrically coupled to the output end; and a thirteenth thin film transistor, and a gate of the thirteenth thin film transistor receives a second global control signal, and a source receives the composite signal, and a drain is electrically coupled to the output end;

the reset module comprises: a first thin film transistor, and both a gate and a source of the first thin film transistor receives a reset signal, and a drain is electrically coupled to the second node;

the voltage stabilizing module comprises: a sixth thin film transistor, and a gate of the sixth thin film transistor receives a control voltage level, and a source is electrically coupled to the first node, and a drain is electrically coupled to the gate of the seventh thin film transistor;

the second node charging module comprises: a third thin film transistor, and a gate of the third thin film transistor receives a M−2th clock signal, and a source receives the control voltage level, and a drain is electrically coupled to the second node; and a second thin film transistor, and a gate of the second thin film transistor is electrically coupled to the first node, and a source receives the M−2th clock signal, and a drain is electrically coupled to the second node;

a working procedure of the GOA driving circuit comprises: a screen awakening stage, a reset stage, a normal display stage and a touch scan stage in order;

in the screen awakening stage, the first global control signal controls the twelfth thin film transistors and the eleventh thin film transistors of the GOA units of all stages to be activated, and the second global control signal controls the thirteenth thin film transistors of the GOA units of all stages to be deactivated; in the reset stage and the normal display stage, the first global control signal controls the twelfth thin film transistors and the eleventh thin film transistors of the GOA units of all stages to be deactivated, and the second global control signal controls the thirteenth thin film transistors of the GOA units of all stages to be deactivated; in the touch scan stage, the second global control signal controls the thirteenth thin film transistors of the GOA units of all stages to be activated, and the first global control signal controls the twelfth thin film transistors and the eleventh thin film transistors of the GOA units of all stages to be deactivated;

in the reset stage, the reset signal provides a single pulse to control the first thin film transistor to be activated to reset a voltage level of the second node, and a duration of the single pulse of the reset signal is at least a sum of durations of initial pulses of a first clock signal and a second clock signal;

in the reset stage and the normal display stage, voltage levels of the composite signal and the control voltage level are one high and one low, and voltage levels of the forward scan control signal and the backward scan control signal are one high and one low; in the touch scan stage, the composite signal is a pulse signal having the same frequency with a touch scan signal;

wherein in the reset stage and the normal display stage, respective clock signals are all periodic pulse signals; in the touch scan stage, voltage levels of the respective clock signals are constant;

wherein the respective thin film transistors are all N-type thin film transistors;

in the screen awakening stage, the first global control signal is high voltage level, and the second global control signal is low voltage level; in the reset stage and the normal display stage, both the first global control signal and the second global control signal are low voltage levels; in the touch scan stage, the second global control signal is high voltage level, and the first global control signal is low voltage level;

in the reset stage and the normal display stage, a voltage level of the composite signal is low voltage level, and the control voltage level is high voltage level; all the respective clock signals are periodic high voltage level pulse signals;

wherein in the touch scan stage, all voltage levels of the respective clock signals are constant low voltage levels;

wherein as performing forward scan, the forward scan control signal is constant high voltage level, and the backward scan control signal is constant low voltage level; as performing backward scan, the forward scan control signal is constant low voltage level, and the backward scan control signal is constant high voltage level;

wherein in the first stage GOA unit and the second stage GOA unit, the gate of the ninth thin film transistor receives a start signal of the circuit; in the next to last stage GOA unit and the last stage GOA unit, the gate of the tenth thin film transistor receives the start signal of the circuit;

and the GOA driving circuit comprises four clock signals: a first, a second, a third and a fourth clock signals; as the Mth clock signal is the first clock signal, the M–2th clock signal is the third clock signal; as the Mth clock signal is the second clock signal, the M–2th clock signal is the fourth clock signal; in the reset stage and the normal display stage, pulse periods of the first, second, third and fourth clock signals are the same, and while a pulse signal of the former clock signal is finished, a pulse signal of the latter clock signal is generated.

The benefits of the present invention are: the present invention provides a GOA driving circuit. In the screen awakening stage, the first global control signal controls the twelfth thin film transistors in the GOA units of all stage to be activated for realizing the All Gate On function. The first global control signal controls the eleventh thin film transistors in the GOA units of all stage to be activated to pull down the voltage levels of the second nodes for ensuring the normal output of the output ends; in the reset stage, the reset signal controls the first thin film transistor to reset the voltage level of the second node, and to set the duration of the single pulse of the reset signal to be at least the sum of durations of initial pulses of the first clock signal and the second clock signal for ensuring that the second node is at high voltage level after the screen is awakened so that the output of the GOA driving circuit can be normal, and the touch display panel enters normal display after the screen is awakened; in the touch scan stage, the second global control signal controls the thirteenth thin film transistors in the GOA units of all stage to be activated to make the output ends of the GOA units of the respective stages output composite signals. In this stage, the composite signal is a pulse signal having the same frequency with the touch scan signal for ensuring that the touch scan is normally performed. Accordingly, the GOA driving circuit of the present invention can ensure that the touch display panel performs normal display after the screen is awakened to eliminate the failure risk as the GOA circuit achieves the All Gate On and touch scan function for promoting the stability of the GOA driving circuit.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention. In drawings.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
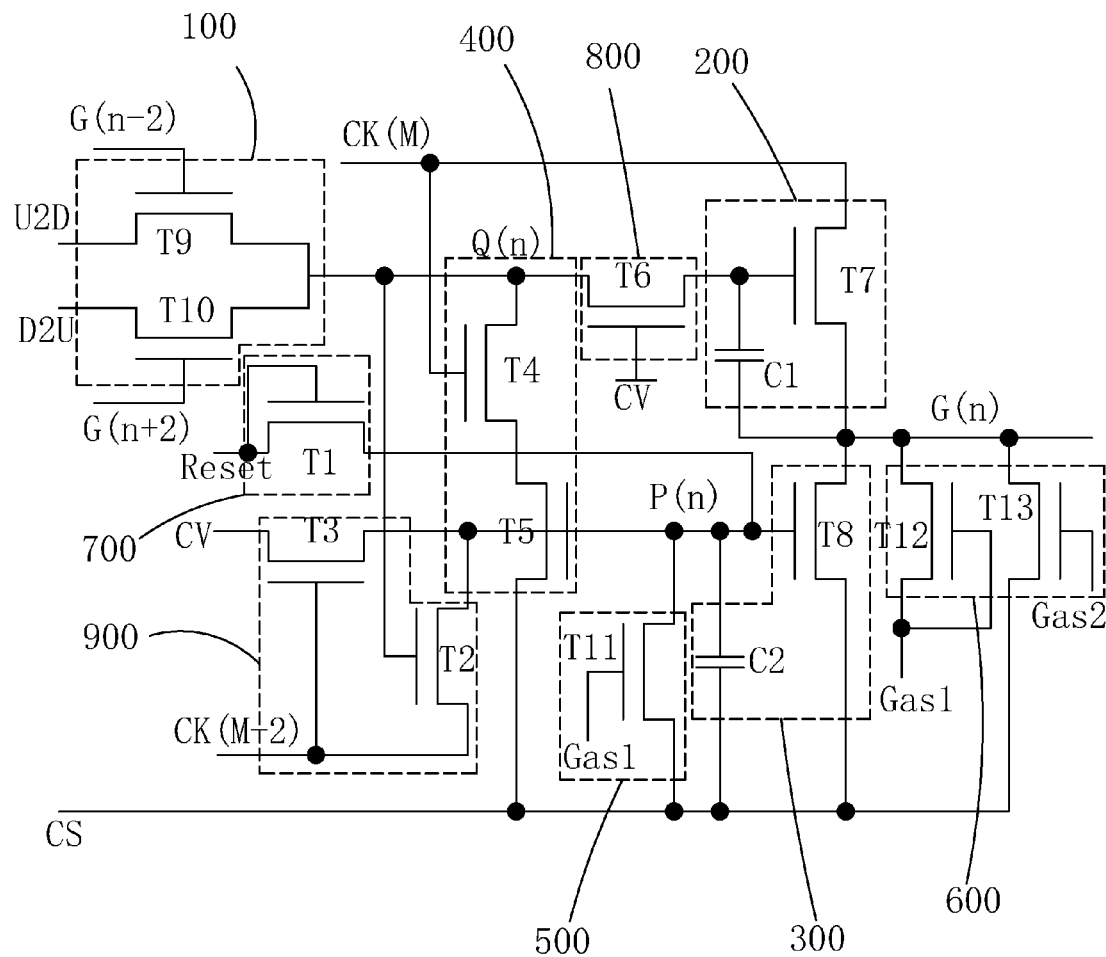
FIG. 1 is a circuit diagram of the first embodiment according to a GOA circuit of the present invention.
Figure 9:
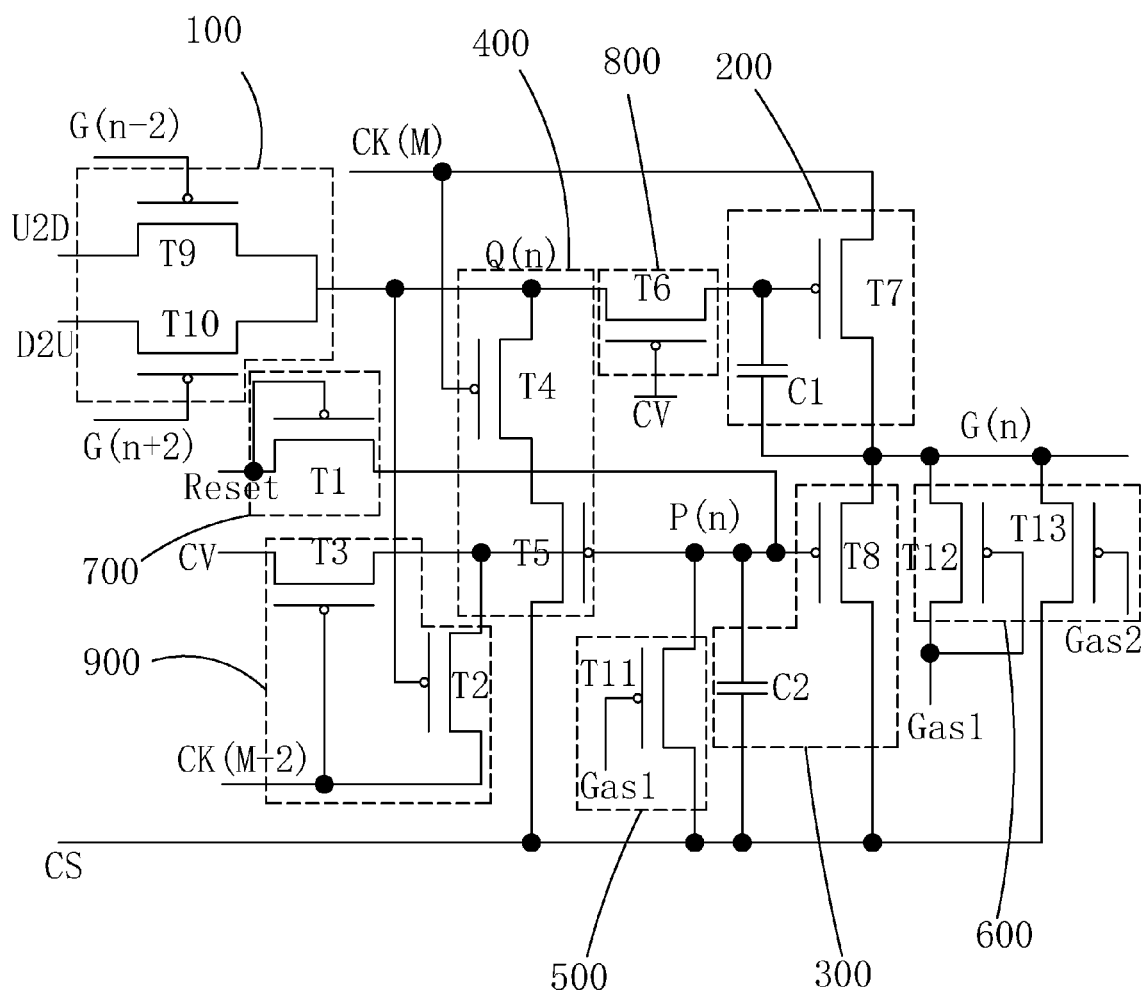
FIG. 9 is a circuit diagram of the second embodiment according to the GOA circuit of the present invention.

Please refer to FIG. 1 or FIG. 9. The present invention provides a GOA driving circuit, comprising GOA units of a plurality of stages which are cascade coupled, and the GOA unit of each stage comprises: a forward-backward scan control module 100, a basic output module 200, a basic output pull-down module 300, a first node control module 400, a second node control module 500, an output control module 600, a reset module 700, a voltage stabilizing module 800 and a second node charging module 900.

n is set to be a positive integer, and except the GOA unit of the first stage, the GOA unit of the second stage, the GOA unit of the next to last stage and the GOA unit of the last stage, in the GOA unit of the nth stage:

the forward-backward scan control module 100 comprises: a ninth thin film transistor T9, and a gate of the ninth thin film transistor T9 is coupled to an output end G(n−2) of the two former n−2th stage GOA unit, and a source receives a forward scan control signal U2D, and a drain is electrically coupled to a first node Q(n); and a tenth thin film transistor T10, and a gate of the tenth thin film transistor T10 is coupled to an output end G(n+2) of the two latter stage n+2th GOA unit, and a source receives a backward scan control signal D2U, and a drain is electrically coupled to the first node Q(n);

the basic output module 200 comprises: a seventh thin film transistor T7, and a gate of the seventh thin film transistor T7 is electrically coupled to a drain of a sixth thin film transistor T6, and a source receives a Mth clock signal CK(M), and a drain is electrically coupled to an output end G(n); and a first capacitor C1, and one end of the first capacitor C1 is electrically coupled to the drain of the sixth thin film transistor T6, and the other end is electrically coupled to the output end G(n);

the basic output pull-down module 300 comprises: an eighth thin film transistor T8, and a gate of the eighth thin film transistor T8 is electrically coupled to the second node P(n), and a source receives a composite signal CS, and a drain is electrically coupled to the output end G(n); and a second capacitor C2, and one end of the second capacitor C2 is electrically coupled to the second node P(n), and the other end receives the composite signal CS;

the first node control module 400 comprises: a fourth thin film transistor T4, and a gate of the fourth thin film transistor T4 receives the Mth clock signal CK(M), and a source is electrically coupled to the a drain of a fifth thin film transistor T5, and a drain is electrically coupled to the first node Q(n); and the fifth thin film transistor T5, and a gate of the fifth thin film transistor T5 is electrically coupled to the second node P(n), and a source receives the composite signal CS;

the second node control module 500 comprises: an eleventh thin film transistor T11, and a gate of the eleventh thin film transistor T11 receives a first global control signal Gas1, and a source receives the composite signal CS, and a drain is electrically coupled to the second node P(n);

the output control module 600 comprises: a twelfth thin film transistor T12, and both a gate and a source of the twelfth thin film transistor T12 receive the first global control signal Gas1, and a drain is electrically coupled to the output end G(n); and a thirteenth thin film transistor T13, and a gate of the thirteenth thin film transistor T13 receives a second global control signal Gas2, and a source receives the composite signal CS, and a drain is electrically coupled to the output end G(n);

the reset module 700 comprises: a first thin film transistor T1, and both a gate and a source of the first thin film transistor T1 receives a reset signal Reset, and a drain is electrically coupled to the second node P(n);

the voltage stabilizing module 800 comprises: a sixth thin film transistor T6, and a gate of the sixth thin film transistor T6 receives a control voltage level CV, and a source is electrically coupled to the first node Q(n), and a drain is electrically coupled to the gate of the seventh thin film transistor T7;

the second node charging module 900 comprises: a third thin film transistor T3, and a gate of the third thin film transistor T3 receives a M−2th clock signal CK(M−2), and a source receives the control voltage level CV, and a drain is electrically coupled to the second node P(n); and a second thin film transistor T2, and a gate of the second thin film transistor T2 is electrically coupled to the first node Q(n), and a source receives the M−2th clock signal CK(M−2), and a drain is electrically coupled to the second node P(n).

A working procedure of the GOA driving circuit comprises: a screen awakening stage, a reset stage, a normal display stage and a touch scan stage in order.

In the screen awakening stage, the first global control signal Gas1 controls the twelfth thin film transistors T12 and the eleventh thin film transistors T11 of the GOA units of all stages to be activated, and the second global control signal Gas2 controls the thirteenth thin film transistors T13 of the GOA units of all stages to be deactivated; in the reset stage and the normal display stage, the first global control signal Gas1 controls the twelfth thin film transistors T12 and the eleventh thin film transistors T11 of the GOA units of all stages to be deactivated, and the second global control signal Gas2 controls the thirteenth thin film transistors T13 of the GOA units of all stages to be deactivated; in the touch scan stage, the second global control signal Gas2 controls the thirteenth thin film transistors T13 of the GOA units of all stages to be activated, and the first global control signal Gas1 controls the twelfth thin film transistors T12 and the eleventh thin film transistors T11 of the GOA units of all stages to be deactivated;

in the reset stage, the reset signal Reset provides a single pulse to control the first thin film transistor T1 to be activated to reset a voltage level of the second node P(n), and a duration of the single pulse of the reset signal Reset is at least a sum of durations of initial pulses of a first clock signal CK(1) and a second clock signal CK(2);

in the reset stage and the normal display stage, voltage levels of the composite signal CS and the control voltage level CV are one high and one low, and voltage levels of the forward scan control signal U2D and the backward scan control signal D2U are one high and one low; in the touch scan stage, the composite signal CS is a pulse signal having the same frequency with a touch scan signal TP.

Figure 2:
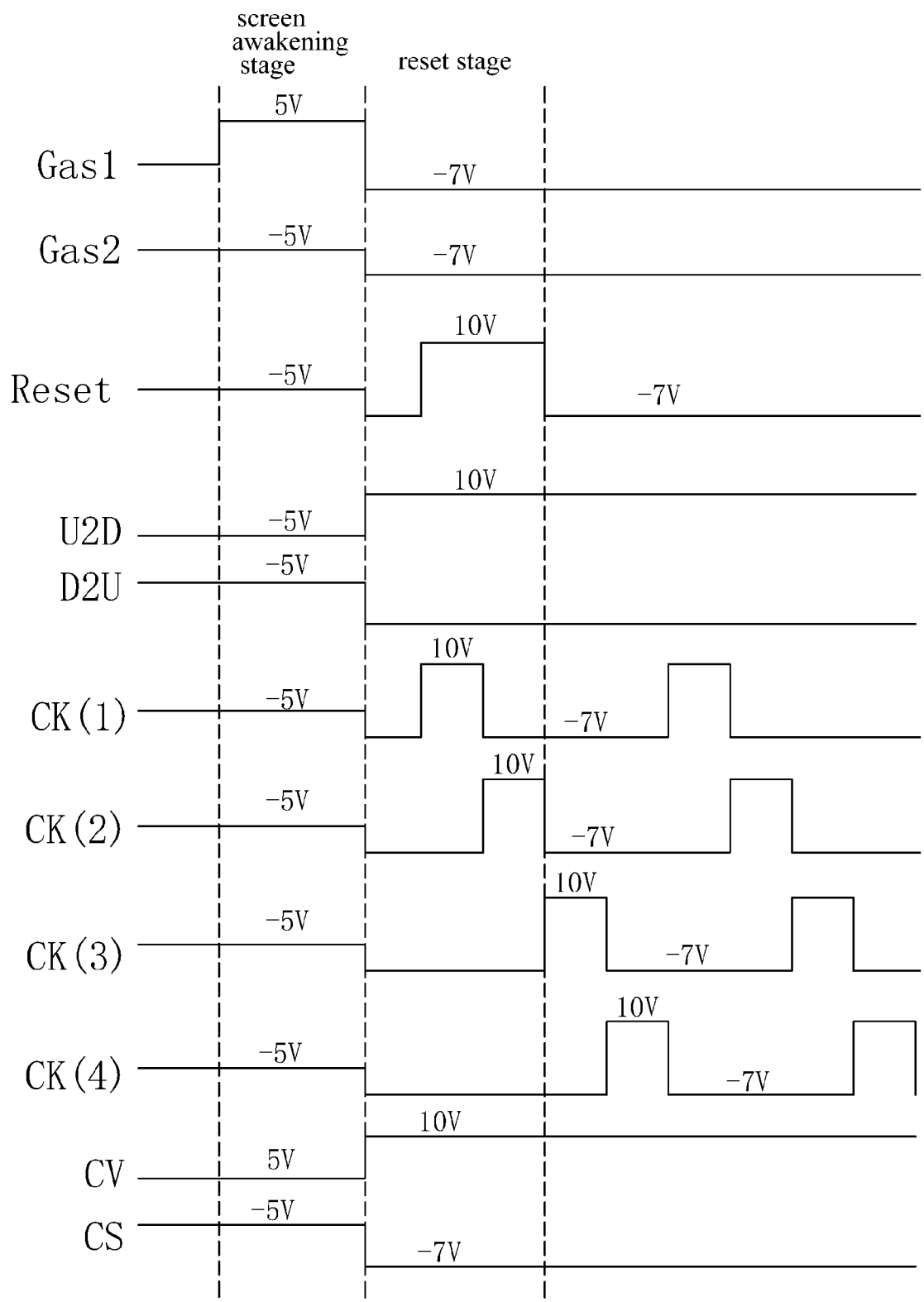
FIG. 2 is a sequence diagram of the GOA circuit shown in FIG. 1 in the screen awakening stage and the reset stage.
Figure 3:
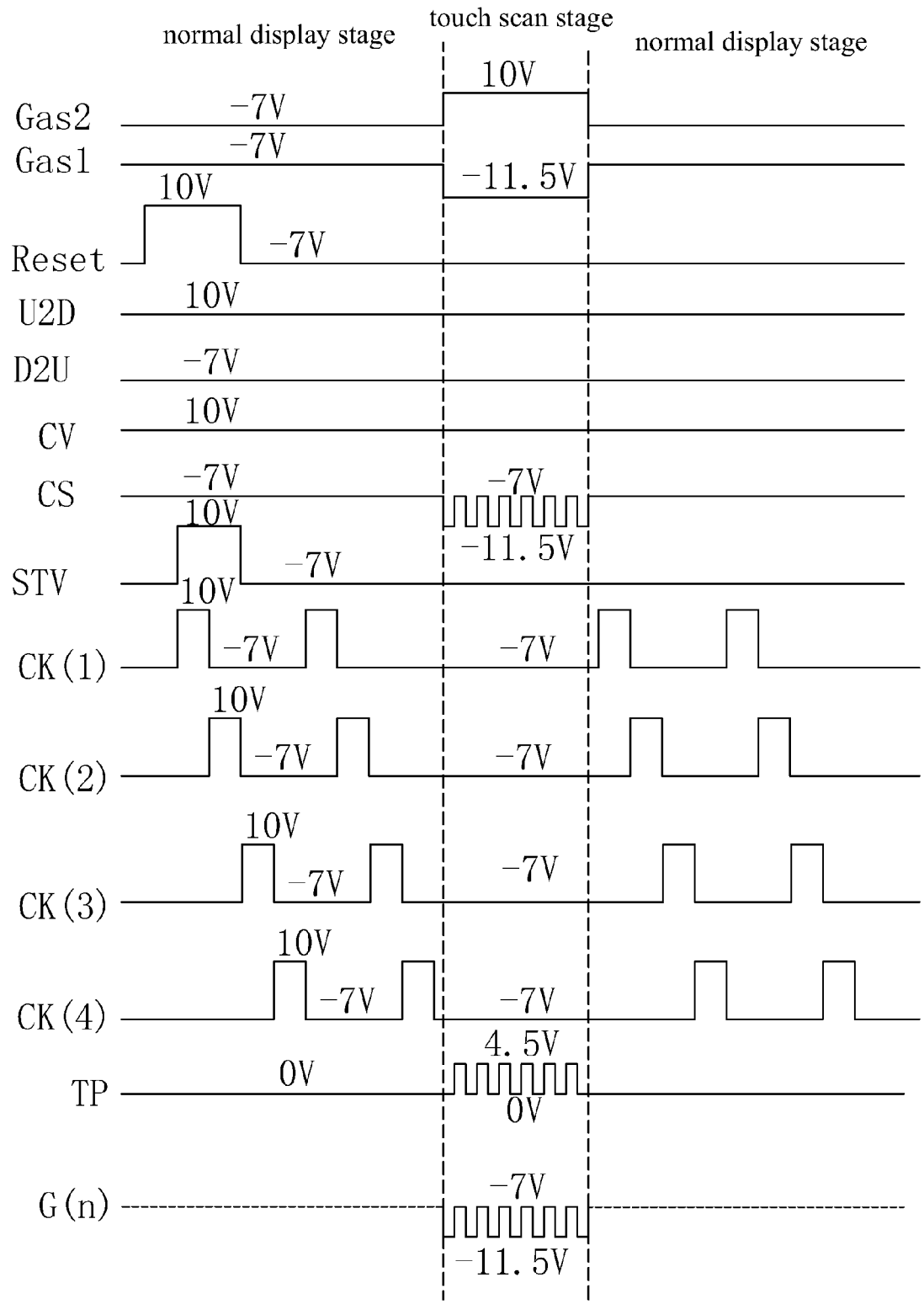
FIG. 3 is a first kind of sequence diagram of the normal display stage and the touch scan stage as the GOA circuit shown in FIG. 1 performs forward scan.
Figure 4:
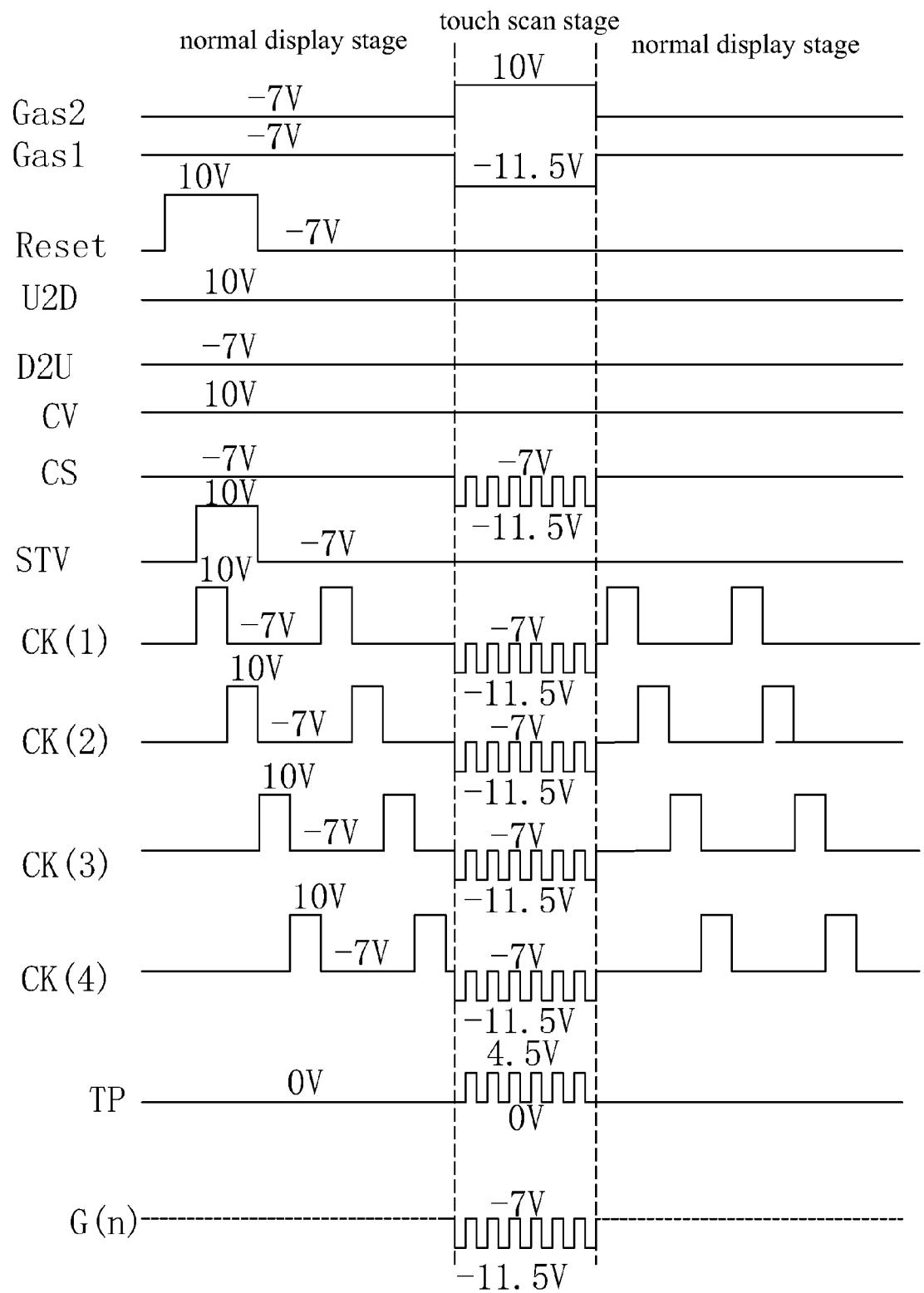
FIG. 4 is a second kind of sequence diagram of the normal display stage and the touch scan stage as the GOA circuit shown in FIG. 1 performs forward scan.

Please refer to FIG. 1, FIG. 2 and FIG. 3 at the same time, or refer to FIG. 1, FIG. 2 and FIG. 4 at the same time. For the first embodiment according to the GOA driving circuit of the present invention, the respective thin film transistors are all N-type thin film transistors; in the screen awakening stage, the first global control signal Gas1 is high voltage level, and the second global control signal Gas2 is low voltage level; in the reset stage and the normal display stage, both the first global control signal Gas1 and the second global control signal Gas2 are low voltage levels; in the touch scan stage, the second global control signal Gas2 is high voltage level, and the first global control signal Gas1 is low voltage level. Significantly, in the reset stage, that a duration of the single pulse of the reset signal is at least a sum of durations of initial pulses of a first clock signal CK(1) and a second clock signal CK(2) means that the single pulse of the reset signal Reset is generated earlier than the first pulse signal of the first clock signal CK(1) or generated with the first pulse signal of the first clock signal CK(1) at the same time, and is finished later than the first pulse signal of the second clock signal CK(2) or finished with the first pulse signal of the second clock signal CK(2) at the same time.

In the reset stage and the normal display stage, a voltage level of the composite signal CS is low voltage level, and the control voltage level CV is high voltage level; all the respective clock signals are periodic high voltage level pulse signals. Selectably, as shown in FIG. 3, in the touch scan stage, all voltage levels of the respective clock signals are constant low voltage levels; selectably, as shown in FIG. 4, after improving the sequence shown in FIG. 3, the respective clock signals are all pulse signals having the same frequency with the touch scan signal TP.

Furthermore, as performing forward scan, the forward scan control signal U2D is constant high voltage level, and the backward scan control signal D2U is constant low voltage level; as performing backward scan, the forward scan control signal U2D is constant low voltage level, and the backward scan control signal D2U is constant high voltage level.

Please refer to FIG. 9. For the second embodiment according to the GOA driving circuit of the present invention, the respective thin film transistors are all P-type thin film transistors; and then, in the screen awakening stage, the first global control signal Gas1 is low voltage level, and the second global control signal Gas2 is high voltage level; in the reset stage and the normal display stage, both the first global control signal Gas1 and the second global control signal Gas2 are high voltage levels; in the touch scan stage, the second global control signal Gas2 is low voltage level, and the first global control signal Gas1 is high voltage level.

In the reset stage and the normal display stage, a voltage level of the composite signal CS is high voltage level, and the control voltage level CV is low voltage level; all the respective clock signals are periodic high voltage level pulse signals. Selectably, in the touch scan stage, all voltage levels of the respective clock signals are constant high voltage levels; selectably, after improving the sequence, the respective clock signals are all pulse signals having the same frequency with the touch scan signal TP.

Furthermore, as performing forward scan, the forward scan control signal U2D is constant high voltage level, and the backward scan control signal D2U is constant low voltage level; as performing backward scan, the forward scan control signal U2D is constant low voltage level, and the backward scan control signal D2U is constant high voltage level.

Figure 5:
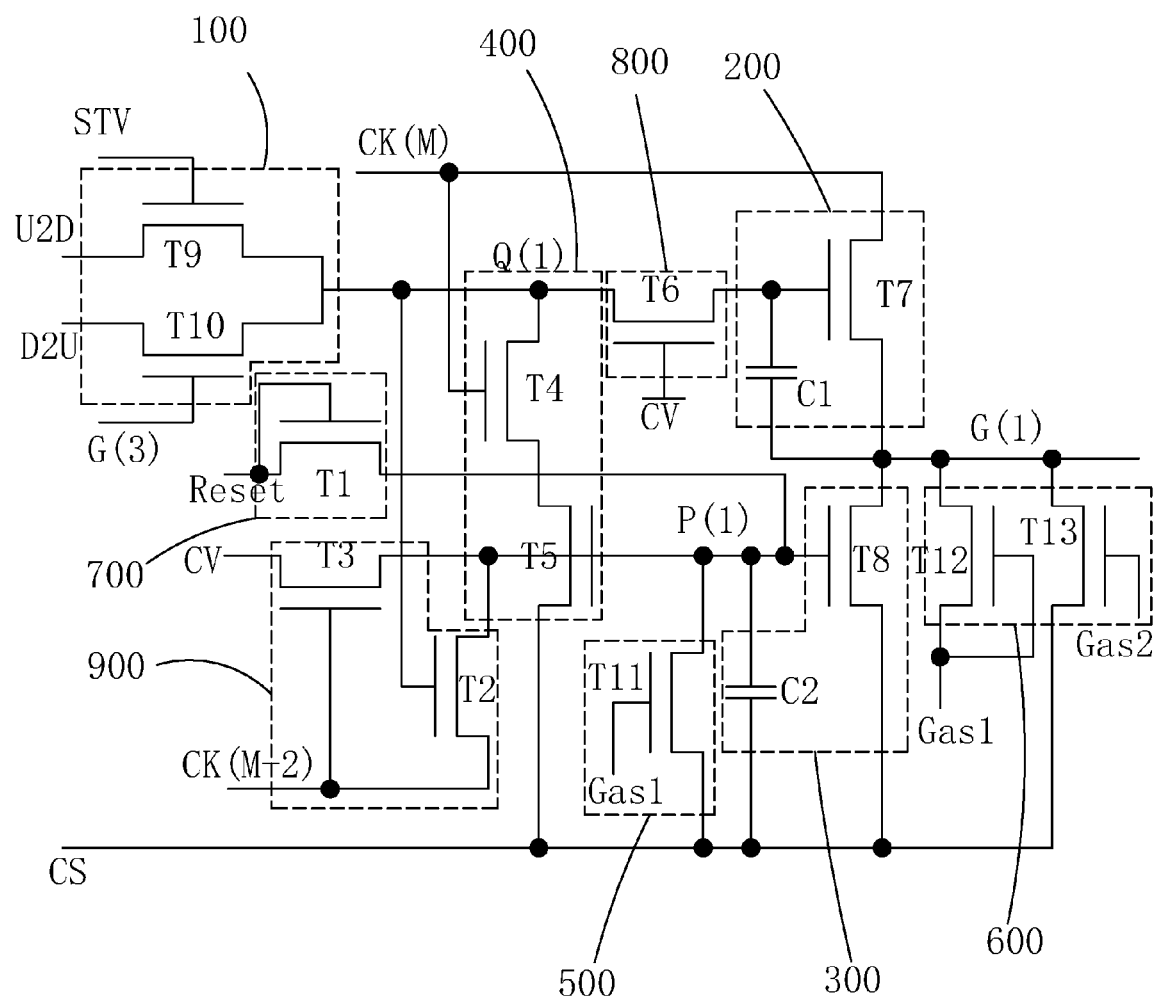
FIG. 5 is a circuit diagram of the first stage GOA unit of the first embodiment according to the GOA circuit of the present invention.
Figure 6:
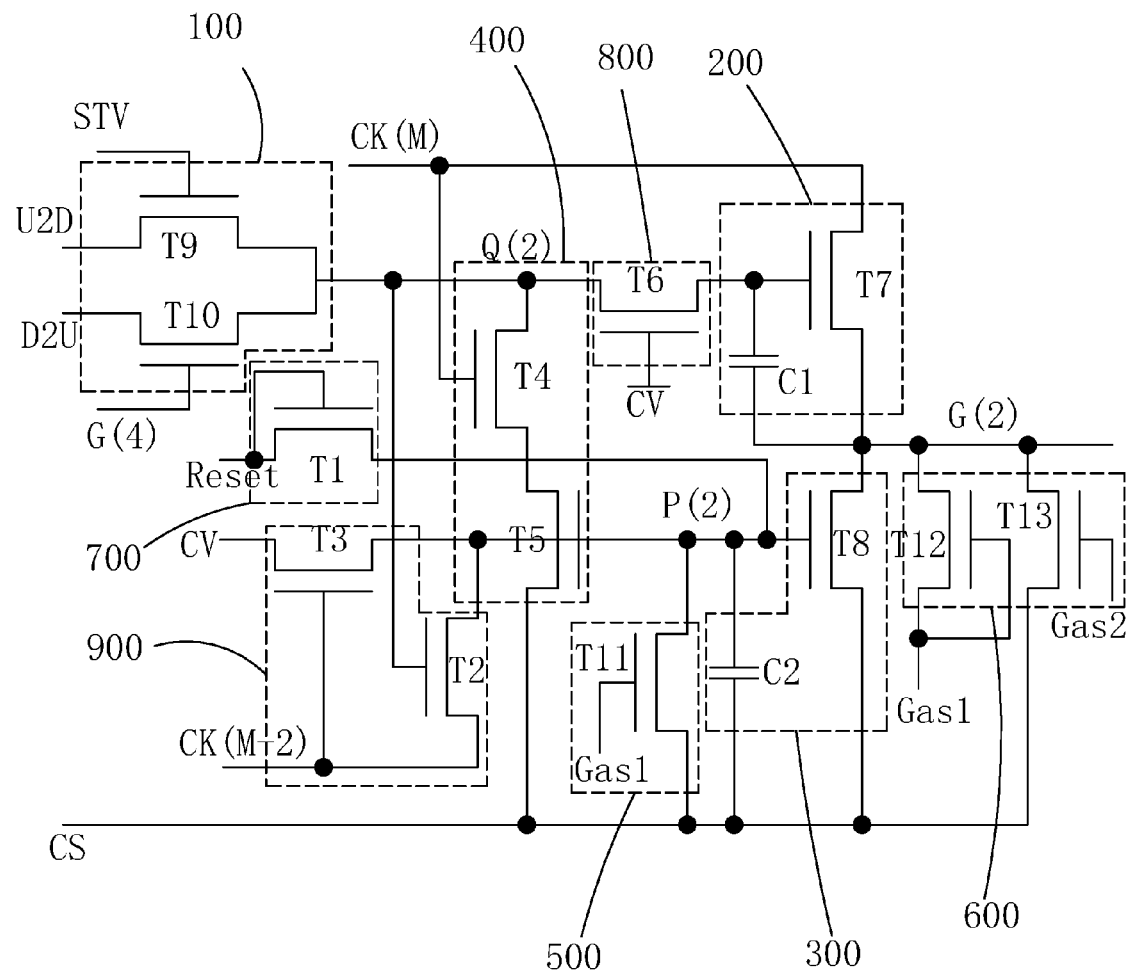
FIG. 6 is a circuit diagram of the second stage GOA unit of the first embodiment according to the GOA circuit of the present invention.
Figure 7:
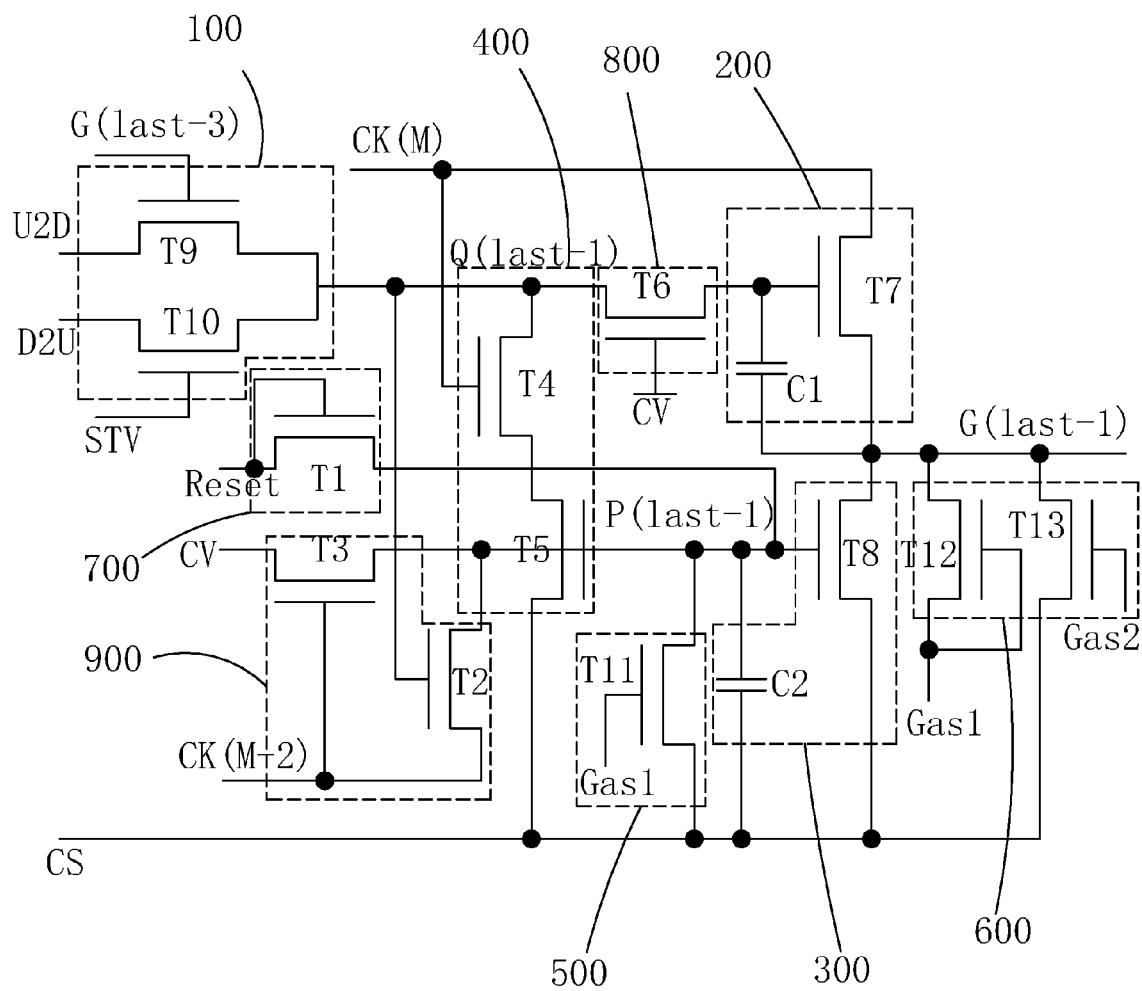
FIG. 7 is a circuit diagram of the next to last stage GOA unit of the first embodiment according to the GOA circuit of the present invention.
Figure 8:
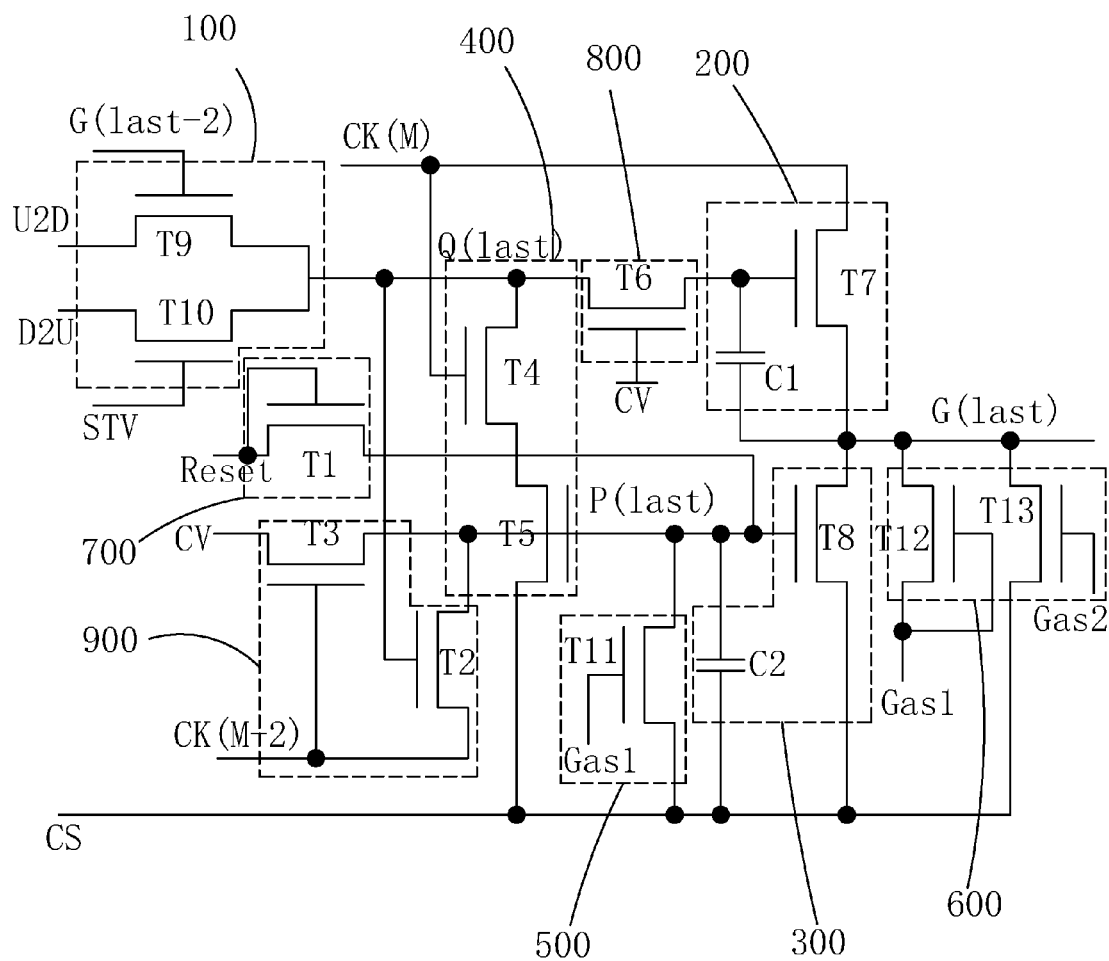
FIG. 8 is a circuit diagram of the last stage GOA unit of the first embodiment according to the GOA circuit of the present invention.

Particularly, referring to FIG. 5 and FIG. 6, in the first stage GOA unit and the second stage GOA unit, the gate of the ninth thin film transistor T9 is electrically coupled to a start signal STV of the circuit. Please refer to FIG. 7 and FIG. 8. In the next to last stage GOA unit and the last stage GOA unit, the gate of the tenth thin film transistor T10 receives a start signal of the circuit.

Specifically, the GOA driving circuit comprises four clock signals: a first, a second, a third and a fourth clock signals CK(1), CK(2), CK(3), CK(4). as the Mth clock signal CK(M) is the first clock signal CK(1), the M−2th clock signal CK(M−2) is the third clock signal CK(3); as the Mth clock signal CK(M) is the second clock signal CK(2), the M−2th clock signal CK(M−2) is the fourth clock signal CK(4). In the reset stage and the normal display stage, the pulse periods of the first, the second, the third and the fourth clock signals CK(1), CK(2), CK(3), CK(4) are the same, and while a pulse signal of the former clock signal is finished, a pulse signal of the latter clock signal is generated. Namely, a first pulse signal of the first clock signal CK(1) is first generated, and a first pulse signal of the second clock signal CK(2) is generated at the same time while the first pulse signal of the first clock signal CK(1) is finished, and a first pulse signal of the third clock signal CK(3) is generated at the same time while the first pulse signal of the second clock signal CK(2) is finished, and a first pulse signal of the fourth clock signal CK(4) is generated at the same time while the first pulse signal of the third clock signal CK(3) is finished, and a second pulse signal of the first clock signal CK(1) is generated at the same time while the first pulse signal of the fourth clock signal CK(4) is finished. Furthermore, as applying in the first embodiment of the present invention, the falling edge of the former clock signal and the rising edge of the latter clock signal are generated at the same time; as applying in the second embodiment of the present invention, the rising edge of the former clock signal and the falling edge of the latter clock signal are generated at the same time.

Please refer to FIG. 1, FIG. 2 and FIG. 3 at the same time, or refer to FIG. 1, FIG. 2 and FIG. 4 at the same time. The forward scan of the first embodiment according to the GOA driving circuit of the present invention is illustrated below for explaining the working procedure of the GOA driving circuit of the present invention:

As aforementioned, in the first embodiment according to the GOA driving circuit of the present invention, the respective thin film transistors are all N-type thin film transistors, and the working procedure of the GOA driving circuit comprises: a screen awakening stage, a reset stage, a normal display stage and a touch scan stage in order. The specific working procedure is below:

1. The Screen Awakening Stage

The first global control signal Gas1 is high voltage level (5V), and controls the twelfth thin film transistors T12 in the GOA units of all stage to be activated, and the output ends of the GOA units of all stage output the high voltage level of the first global control signal Gas1 for realizing the All Gate On function; meanwhile, the first global control signal Gas1 controls the eleventh thin film transistors T11 in the GOA units of all stage to be activated, and in this stage, the composite signal provides low voltage level (−5V), and thus to pull down the voltage levels of the second nodes of the GOA units of all stages so that the eighth thin film transistors T8 are deactivated for preventing it from pulling down the output end G(n) and ensuring that the All Gate On function can smoothly run.

The second global control signal Gas2 is low voltage level (−5V) to control the thirteenth thin film transistors T13 in the GOA units of all stage to be deactivated. Similarly, it prevents the composite signal CS from pulling down the output end G(n).

2 The Reset Stage

Both the first global control signal Gas1 and the second global control signal Gas2 are low voltage levels (−7V) to control the eleventh thin film transistors T11, the twelfth thin film transistors T12 and the thirteenth thin film transistors T13 in the GOA units of all stage to be deactivated; the reset signal Reset provides a single high voltage level pulse (10V) to control the first thin film transistor T1 to be activated, and the high voltage level (10V) of the control voltage level CV resets the voltage level of the second node P(n) back to high voltage level through the first thin film transistor, and the eighth thin film transistor T8 is activated, and in this stage, the composite signal CS provides low voltage levels (−7V), and thus to pull down the output end G(n) to low voltage level.

Particularly, the single pulse of the reset signal Reset is generated earlier than the first pulse signal of the first clock signal CK(1) or generated with the first pulse signal of the first clock signal CK(1) at the same time, and is finished later than the first pulse signal of the second clock signal CK(2) or finished with the first pulse signal of the second clock signal CK(2) at the same time. Namely, the duration of the single pulse of the reset signal is at least the sum of durations of initial pulses of the first clock signal CK(1) and the second clock signal CK(2), which can ensure that the second node P(n) is at high voltage level after the screen is awakened so that the output of the GOA driving circuit can be normal, and the touch display panel enters normal display after the screen is awakened.

3. The Normal Display Stage

Both the first global control signal Gas1 and the second global control signal Gas2 are still low voltage levels (−7V) to control the eleventh thin film transistors T11, the twelfth thin film transistors T12 and the thirteenth thin film transistors T13 in the GOA units of all stage to be deactivated; the reset signal Reset becomes low voltage level (−7V), and the first thin film transistor T1 is deactivated. The composite signal CS is low voltage level (−7V), and the control voltage level CV is high voltage level (10V); all the respective clock signals are periodic high voltage level pulse signals; the forward scan control signal U2D is constant high voltage level (10V), and the backward scan control signal D2U is constant low voltage level (−7V). First, the output end G(n−2) of the two former n−2th stage GOA unit or the start signal STV of the circuit provides high voltage level (10V), and the M−2th clock signal CK(M−2) provides high voltage level (10V), and the ninth thin film transistor T9 is activated, and the first node Q(n) is charged to be high voltage level, and the third thin film transistor T3 is activated, and the second node P(n) is charged to be high voltage level, and the eighth thin film transistor T8 is activated, and the output end G(n) remains to be pulled down to be low voltage level (−7V);

then, both the output end G(n−2) of the two former n−2th stage GOA unit and the M−2th clock signal CK(M−2) become low voltage levels (−7V), and the ninth and the third thin film transistors T9, T3 are deactivated, and the first node Q(n) is acted by the function of the first capacitor C1 to be kept to be high voltage level, and the second thin film transistor T2 is activated, and the second node P(n) is pulled down to low voltage level;

and then, the Mth clock signal CK(M) becomes high voltage level (10V), and because the high voltage level of the control voltage level CV constantly makes the sixth thin film transistor T6 be activated, the seventh thin film transistor T7 is controlled by the first node Q(n) to be activated, and the output end G(n) outputs the high voltage level (10V) of the Mth clock signal; after CK(M) becomes low voltage level (−7V), the output end G(n) outputs the low voltage level (−7V) of the Mth clock signal;

and then, the M−2th clock signal CK(M−2) become high voltage level (10V) again, and the third thin film transistor T3 is activated, and the second node P(n) is charged to high voltage level, and the fifth and the eighth thin film transistors T5, T8 are activated, and the output end G(n) is pulled down to low voltage level (−7V);

afterward, the Mth clock signal CK(M) becomes high voltage level (10V) again, and the fourth and the fifth thin film transistors T4, T5 are activated, and the first node Q(n) is pulled down to low voltage level, and then the output end G(n) and the first node Q(n) are kept to be low voltage levels (−7V);

4. The Touch Scan Stage

The second global control signal Gas2 provides high voltage level (10V), and the first global control signal Gas1 provides low voltage level (−11.5V), and the twelfth thin film transistor T12 and the first thin film transistor T11 are deactivated, and the thirteenth thin film transistor T13 is activated, and the composite signal CS is transmitted to the output end G(n) to be outputted through the thirteenth thin film transistor T13, and in this stage, the composite signal CS is a pulse signal having the same frequency with the touch scan signal TP, and the voltage level of the touch scan signal TP jumps between 0V and 4.5V, and the voltage level of the composite signal CS jumps between −7V and −11.5V, which can ensure that the touch scan is normally performed.

As the sequence shown in FIG. 3, in the touch scan stage, the voltage levels of all the first to fourth clock signals CK(1)-CK(4) are constant low voltage levels (−7V). In comparison with FIG. 3, the sequence shown in FIG./ 4 is improved, the first to fourth clock signals CK(1)-CK(4) are all pulse signals having the same frequency with the touch scan signal TP, and the voltage levels jump between −7V and −11.5V. Such improvement can eliminate the abnormal output of the output end G(n) of the GOA unit in which the first node Q(n) is high voltage level, and the stability of the GOA circuit is promoted in advance.

The working procedure of the backward scan is similar with the forward scan. What is need is to change the backward scan control signal D2U to be constant high voltage level, and to change the forward scan control signal U2D to be low voltage level, and the scan direction is changed from scanning from the first stage GOA unit toward the last stage GOA unit to be scanning from the last stage GOA unit toward the first stage GOA unit. No detail description is repeated here.

The second embodiment shown in FIG. 9 is similar with the specific working procedure of the aforesaid first embodiment. Only the high and low of the respective signals and nodes need to be changed. No detail description is repeated here.

In conclusion, the present invention provides a GOA driving circuit. In the screen awakening stage, the first global control signal controls the twelfth thin film transistors in the GOA units of all stage to be activated for realizing the All Gate On function. The first global control signal controls the eleventh thin film transistors in the GOA units of all stage to be activated to pull down the voltage levels of the second nodes for ensuring the normal output of the output ends; in the reset stage, the reset signal controls the first thin film transistor to reset the voltage level of the second node, and to set the duration of the single pulse of the reset signal to be at least the sum of durations of initial pulses of the first clock signal and the second clock signal for ensuring that the second node is at high voltage level after the screen is awakened so that the output of the GOA driving circuit can be normal, and the touch display panel enters normal display after the screen is awakened; in the touch scan stage, the second global control signal controls the thirteenth thin film transistors in the GOA units of all stage to be activated to make the output ends of the GOA units of the respective stages output composite signals. In this stage, the composite signal is a pulse signal having the same frequency with the touch scan signal for ensuring that the touch scan is normally performed. Accordingly, the GOA driving circuit of the present invention can ensure that the touch display panel performs normal display after the screen is awakened to eliminate the failure risk as the GOA circuit achieves the All Gate On and touch scan function for promoting the stability of the GOA driving circuit.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A GOA driving circuit, comprising GOA units of a plurality of stages which are cascade coupled, and the GOA unit of each stage comprises: a forward-backward scan control module, a basic output module, a basic output pull-down module, a first node control module, a second node control module, an output control module, a reset module, a voltage stabilizing module and a second node charging module;

n is set to be a positive integer, and except the GOA unit of the first stage, the GOA unit of the second stage, the GOA unit of the next to last stage and the GOA unit of the last stage, in the GOA unit of the nth stage:

the forward-backward scan control module comprises: a ninth thin film transistor, and a gate of the ninth thin film transistor is coupled to an output end of the two former n−2th stage GOA unit, and a source receives a forward scan control signal, and a drain is electrically coupled to a first node; and a tenth thin film transistor, and a gate of the tenth thin film transistor is coupled to an output end of the two latter stage n+2th GOA unit, and a source receives a backward scan control signal, and a drain is electrically coupled to the first node;

the basic output module comprises: a seventh thin film transistor, and a gate of the seventh thin film transistor is electrically coupled to a drain of a sixth thin film transistor, and a source receives a Mth clock signal, and a drain is electrically coupled to an output end; and a first capacitor, and one end of the first capacitor is electrically coupled to the drain of the sixth thin film transistor, and the other end is electrically coupled to the output end;

the basic output pull-down module comprises: an eighth thin film transistor, and a gate of the eighth thin film transistor is electrically coupled to a second node, and a source receives a composite signal, and a drain is electrically coupled to the output end; and a second capacitor, and one end of the second capacitor is electrically coupled to the second node, and the other end receives the composite signal;

the first node control module comprises: a fourth thin film transistor, and a gate of the fourth thin film transistor receives the Mth clock signal, and a source is electrically coupled to the a drain of a fifth thin film transistor, and a drain is electrically coupled to the first node; and the fifth thin film transistor, and a gate of the fifth thin film transistor is electrically coupled to the second node, and a source receives the composite signal;

the second node control module comprises: an eleventh thin film transistor, and a gate of the eleventh thin film transistor receives a first global control signal, and a source receives the composite signal, and a drain is electrically coupled to the second node;

the output control module comprises: a twelfth thin film transistor, and both a gate and a source of the twelfth thin film transistor receive the first global control signal, and a drain is electrically coupled to the output end; and a thirteenth thin film transistor, and a gate of the thirteenth thin film transistor receives a second global control signal, and a source receives the composite signal, and a drain is electrically coupled to the output end;

the reset module comprises: a first thin film transistor, and both a gate and a source of the first thin film transistor receives a reset signal, and a drain is electrically coupled to the second node;

the voltage stabilizing module comprises: the sixth thin film transistor, and a gate of the sixth thin film transistor receives a control voltage level, and a source is electrically coupled to the first node, and a drain is electrically coupled to the gate of the seventh thin film transistor;

the second node charging module comprises: a third thin film transistor, and a gate of the third thin film transistor receives a M−2th clock signal, and a source receives the control voltage level, and a drain is electrically coupled to the second node; and a second thin film transistor, and a gate of the second thin film transistor is electrically coupled to the first node, and a source receives the M−2th clock signal, and a drain is electrically coupled to the second node;

a working procedure of the GOA driving circuit comprises: a screen awakening stage, a reset stage, a normal display stage and a touch scan stage in order;

in the screen awakening stage, the first global control signal controls the twelfth thin film transistors and the eleventh thin film transistors of the GOA units of all stages to be activated, and the second global control signal controls the thirteenth thin film transistors of the GOA units of all stages to be deactivated; in the reset stage and the normal display stage, the first global control signal controls the twelfth thin film transistors and the eleventh thin film transistors of the GOA units of all stages to be deactivated, and the second global control signal controls the thirteenth thin film transistors of the GOA units of all stages to be deactivated; in the touch scan stage, the second global control signal controls the thirteenth thin film transistors of the GOA units of all stages to be activated, and the first global control signal controls the twelfth thin film transistors and the eleventh thin film transistors of the GOA units of all stages to be deactivated;

in the reset stage, the reset signal provides a single pulse to control the first thin film transistor to be activated to reset a voltage level of the second node, and a duration of the single pulse of the reset signal is at least a sum of durations of initial pulses of a first clock signal and a second clock signal;

in the reset stage and the normal display stage, voltage levels of the composite signal and the control voltage level are one high and one low, and voltage levels of the forward scan control signal and the backward scan control signal are one high and one low; in the touch scan stage, the composite signal is a pulse signal having the same frequency with a touch scan signal.

2. The GOA driving circuit according to claim 1, wherein in the reset stage and the normal display stage, respective clock signals are all periodic pulse signals; in the touch scan stage, voltage levels of the respective clock signals are constant.

3. The GOA driving circuit according to claim 1, wherein in the reset stage and the normal display stage, respective clock signals are all periodic pulse signals; in the touch scan stage, the respective clock signals are pulse signals having the same frequency with the touch scan signal.

4. The GOA driving circuit according to claim 2, wherein the respective thin film transistors are all N-type thin film transistors;

in the screen awakening stage, the first global control signal is high voltage level, and the second global control signal is low voltage level; in the reset stage and the normal display stage, both the first global control signal and the second global control signal are low voltage levels; in the touch scan stage, the second global control signal is high voltage level, and the first global control signal is low voltage level;

in the reset stage and the normal display stage, a voltage level of the composite signal is low voltage level, and the control voltage level is high voltage level; all the respective clock signals are periodic high voltage level pulse signals.

5. The GOA driving circuit according to claim 3, wherein the respective thin film transistors are all N-type thin film transistors;

in the screen awakening stage, the first global control signal is high voltage level, and the second global control signal is low voltage level; in the reset stage and the normal display stage, both the first global control signal and the second global control signal are low voltage levels; in the touch scan stage, the second global control signal is high voltage level, and the first global control signal is low voltage level;

in the reset stage and the normal display stage, a voltage level of the composite signal is low voltage level, and the control voltage level is high voltage level; all the respective clock signals are periodic high voltage level pulse signals.

6. The GOA driving circuit according to claim 4, wherein in the touch scan stage, all voltage levels of the respective clock signals are constant low voltage levels.

7. The GOA driving circuit according to claim 5, wherein in the touch scan stage, all voltage levels of the respective clock signals are constant low voltage levels.

8. The GOA driving circuit according to claim 4, wherein as performing forward scan, the forward scan control signal is constant high voltage level, and the backward scan control signal is constant low voltage level; as performing backward scan, the forward scan control signal is constant low voltage level, and the backward scan control signal is constant high voltage level.

9. The GOA driving circuit according to claim 5, wherein as performing forward scan, the forward scan control signal is constant high voltage level, and the backward scan control signal is constant low voltage level; as performing backward scan, the forward scan control signal is constant low voltage level, and the backward scan control signal is constant high voltage level.

10. The GOA driving circuit according to claim 2, wherein the respective thin film transistors are all P-type thin film transistors;
in the screen awakening stage, the first global control signal is low voltage level, and the second global control signal is high voltage level; in the reset stage and the normal display stage, both the first global control signal and the second global control signal are high voltage levels; in the touch scan stage, the second global control signal is low voltage level, and the first global control signal is high voltage level;
in the reset stage and the normal display stage, a voltage level of the composite signal is high voltage level, and the control voltage level is low voltage level; all the respective clock signals are periodic high voltage level pulse signals.

11. The GOA driving circuit according to claim 3, wherein the respective thin film transistors are all P-type thin film transistors;
in the screen awakening stage, the first global control signal is low voltage level, and the second global control signal is high voltage level; in the reset stage and the normal display stage, both the first global control signal and the second global control signal are high voltage levels; in the touch scan stage, the second global control signal is low voltage level, and the first global control signal is high voltage level;
in the reset stage and the normal display stage, a voltage level of the composite signal is high voltage level, and the control voltage level is low voltage level; all the respective clock signals are periodic high voltage level pulse signals.

12. The GOA driving circuit according to claim 10, wherein in the touch scan stage, all voltage levels of the respective clock signals are constant high voltage levels.

13. The GOA driving circuit according to claim 11, wherein in the touch scan stage, all voltage levels of the respective clock signals are constant high voltage levels.

14. The GOA driving circuit according to claim 10, wherein as performing forward scan, the forward scan control signal is constant high voltage level, and the backward scan control signal is constant low voltage level; as performing backward scan, the forward scan control signal is constant low voltage level, and the backward scan control signal is constant high voltage level.

15. The GOA driving circuit according to claim 11, wherein as performing forward scan, the forward scan control signal is constant high voltage level, and the backward scan control signal is constant low voltage level; as performing backward scan, the forward scan control signal is constant low voltage level, and the backward scan control signal is constant high voltage level.

16. The GOA driving circuit according to claim 1, wherein in the first stage GOA unit and the second stage GOA unit, the gate of the ninth thin film transistor receives a start signal of the circuit; in the next to last stage GOA unit and the last stage GOA unit, the gate of the tenth thin film transistor receives the start signal of the circuit;
and the GOA driving circuit comprises four clock signals: a first, a second, a third and a fourth clock signals; as the Mth clock signal is the first clock signal, the M−2th clock signal is the third clock signal; as the Mth clock signal is the second clock signal, the M−2th clock signal is the fourth clock signal; in the reset stage and the normal display stage, pulse periods of the first, second, third and fourth clock signals are the same, and while a pulse signal of the former clock signal is finished, a pulse signal of the latter clock signal is generated.

17. A GOA driving circuit, comprising GOA units of a plurality of stages which are cascade coupled, and the GOA unit of each stage comprises: a forward-backward scan control module, a basic output module, a basic output pull-down module, a first node control module, a second node control module, an output control module, a reset module, a voltage stabilizing module and a second node charging module;
n is set to be a positive integer, and except the GOA unit of the first stage, the GOA unit of the second stage, the GOA unit of the next to last stage and the GOA unit of the last stage, in the GOA unit of the nth stage:
the forward-backward scan control module comprises: a ninth thin film transistor, and a gate of the ninth thin film transistor is coupled to an output end of the two former n−2th stage GOA unit, and a source receives a forward scan control signal, and a drain is electrically coupled to a first node; and a tenth thin film transistor, and a gate of the tenth thin film transistor is coupled to an output end of the two latter stage n+2th GOA unit, and a source receives a backward scan control signal, and a drain is electrically coupled to the first node;
the basic output module comprises: a seventh thin film transistor, and a gate of the seventh thin film transistor is electrically coupled to a drain of a sixth thin film transistor, and a source receives a Mth clock signal, and a drain is electrically coupled to an output end; and a first capacitor, and one end of the first capacitor is electrically coupled to the drain of the sixth thin film transistor, and the other end is electrically coupled to the output end;
the basic output pull-down module comprises: an eighth thin film transistor, and a gate of the eighth thin film transistor is electrically coupled to a second node, and a source receives a composite signal, and a drain is electrically coupled to the output end; and a second capacitor, and one end of the second capacitor is electrically coupled to the second node, and the other end receives the composite signal;
the first node control module comprises: a fourth thin film transistor, and a gate of the fourth thin film transistor receives the Mth clock signal, and a source is electrically coupled to the a drain of a fifth thin film transistor, and a drain is electrically coupled to the first node; and the fifth thin film transistor, and a gate of the fifth thin film transistor is electrically coupled to the second node, and a source receives the composite signal;
the second node control module comprises: an eleventh thin film transistor, and a gate of the eleventh thin film transistor receives a first global control signal, and a source receives the composite signal, and a drain is electrically coupled to the second node;
the output control module comprises: a twelfth thin film transistor, and both a gate and a source of the twelfth thin film transistor receive the first global control signal, and a drain is electrically coupled to the output end; and a thirteenth thin film transistor, and a gate of the thirteenth thin film transistor receives a second global control signal, and a source receives the composite signal, and a drain is electrically coupled to the output end;

the reset module comprises: a first thin film transistor, and both a gate and a source of the first thin film transistor receives a reset signal, and a drain is electrically coupled to the second node;

the voltage stabilizing module comprises: the sixth thin film transistor, and a gate of the sixth thin film transistor receives a control voltage level, and a source is electrically coupled to the first node, and a drain is electrically coupled to the gate of the seventh thin film transistor;

the second node charging module comprises: a third thin film transistor, and a gate of the third thin film transistor receives a M–2th clock signal, and a source receives the control voltage level, and a drain is electrically coupled to the second node; and a second thin film transistor, and a gate of the second thin film transistor is electrically coupled to the first node, and a source receives the M–2th clock signal, and a drain is electrically coupled to the second node;

a working procedure of the GOA driving circuit comprises: a screen awakening stage, a reset stage, a normal display stage and a touch scan stage in order;

in the screen awakening stage, the first global control signal controls the twelfth thin film transistors and the eleventh thin film transistors of the GOA units of all stages to be activated, and the second global control signal controls the thirteenth thin film transistors of the GOA units of all stages to be deactivated; in the reset stage and the normal display stage, the first global control signal controls the twelfth thin film transistors and the eleventh thin film transistors of the GOA units of all stages to be deactivated, and the second global control signal controls the thirteenth thin film transistors of the GOA units of all stages to be deactivated; in the touch scan stage, the second global control signal controls the thirteenth thin film transistors of the GOA units of all stages to be activated, and the first global control signal controls the twelfth thin film transistors and the eleventh thin film transistors of the GOA units of all stages to be deactivated;

in the reset stage, the reset signal provides a single pulse to control the first thin film transistor to be activated to reset a voltage level of the second node, and a duration of the single pulse of the reset signal is at least a sum of durations of initial pulses of a first clock signal and a second clock signal;

in the reset stage and the normal display stage, voltage levels of the composite signal and the control voltage level are one high and one low, and voltage levels of the forward scan control signal and the backward scan control signal are one high and one low; in the touch scan stage, the composite signal is a pulse signal having the same frequency with a touch scan signal;

wherein in the reset stage and the normal display stage, respective clock signals are all periodic pulse signals; in the touch scan stage, voltage levels of the respective clock signals are constant;

wherein the respective thin film transistors are all N-type thin film transistors;

in the screen awakening stage, the first global control signal is high voltage level, and the second global control signal is low voltage level; in the reset stage and the normal display stage, both the first global control signal and the second global control signal are low voltage levels; in the touch scan stage, the second global control signal is high voltage level, and the first global control signal is low voltage level;

in the reset stage and the normal display stage, a voltage level of the composite signal is low voltage level, and the control voltage level is high voltage level; all the respective clock signals are periodic high voltage level pulse signals;

wherein in the touch scan stage, all voltage levels of the respective clock signals are constant low voltage levels;

wherein as performing forward scan, the forward scan control signal is constant high voltage level, and the backward scan control signal is constant low voltage level; as performing backward scan, the forward scan control signal is constant low voltage level, and the backward scan control signal is constant high voltage level;

wherein in the first stage GOA unit and the second stage GOA unit, the gate of the ninth thin film transistor receives a start signal of the circuit; in the next to last stage GOA unit and the last stage GOA unit, the gate of the tenth thin film transistor receives the start signal of the circuit;

and the GOA driving circuit comprises four clock signals: a first, a second, a third and a fourth clock signals; as the Mth clock signal is the first clock signal, the M–2th clock signal is the third clock signal; as the Mth clock signal is the second clock signal, the M–2th clock signal is the fourth clock signal; in the reset stage and the normal display stage, pulse periods of the first, second, third and fourth clock signals are the same, and while a pulse signal of the former clock signal is finished, a pulse signal of the latter clock signal is generated.

* * * * *